United States Patent [19]

Cutler

[11] Patent Number: 5,146,184
[45] Date of Patent: Sep. 8, 1992

[54] ATOMIC CLOCK SYSTEM WITH IMPROVED SERVO SYSTEM

[75] Inventor: Len Cutler, Los Altos Hills, Calif.

[73] Assignee: Hewlett-Packard Company, Palo Alto, Calif.

[21] Appl. No.: 739,276

[22] Filed: Aug. 1, 1991

[51] Int. Cl.$^5$ .................... H03B 9/00; H03L 7/26
[52] U.S. Cl. .................................. 331/3; 331/79
[58] Field of Search ............ 331/3, 79, 80, 81, 82, 331/83, 84, 94.1, 104

[56] References Cited

U.S. PATENT DOCUMENTS 4,914,403 4/1990 Nakajima et al. .................. 331/3

OTHER PUBLICATIONS

"Full Digital-Processing in a New Commercial Cesium Standard" by Jean Rabian and Pascal Rochat. 2nd European Frequency and Time Forum Neuchatel-16-1-7-18 Mar. 1988 Session AFS-02, No. 4.

*Primary Examiner*—David Mis

[57] ABSTRACT

An improved atomic beam clock apparatus and method are disclosed. The invention substantially reduces errors arising from Rabi pulling and variations in the frequency standard resulting from variations in the amplitude of the microwave signal used to excite the atomic beam. The invention includes a servo loop that adjusts both the microwave frequency and amplitude. The servo loop measures the output of a beam detector at two pairs of microwave frequencies. The output of the detector at each frequency in each pair of frequencies is measured for two different microwave amplitudes. The amplitude data is used to adjust the microwave power such that the output of the detector is maximized at each pair of frequencies. The amplitude modulation scheme of the present invention may also be applied very advantageously to conventional two point frequency modulation schemes.

12 Claims, 5 Drawing Sheets

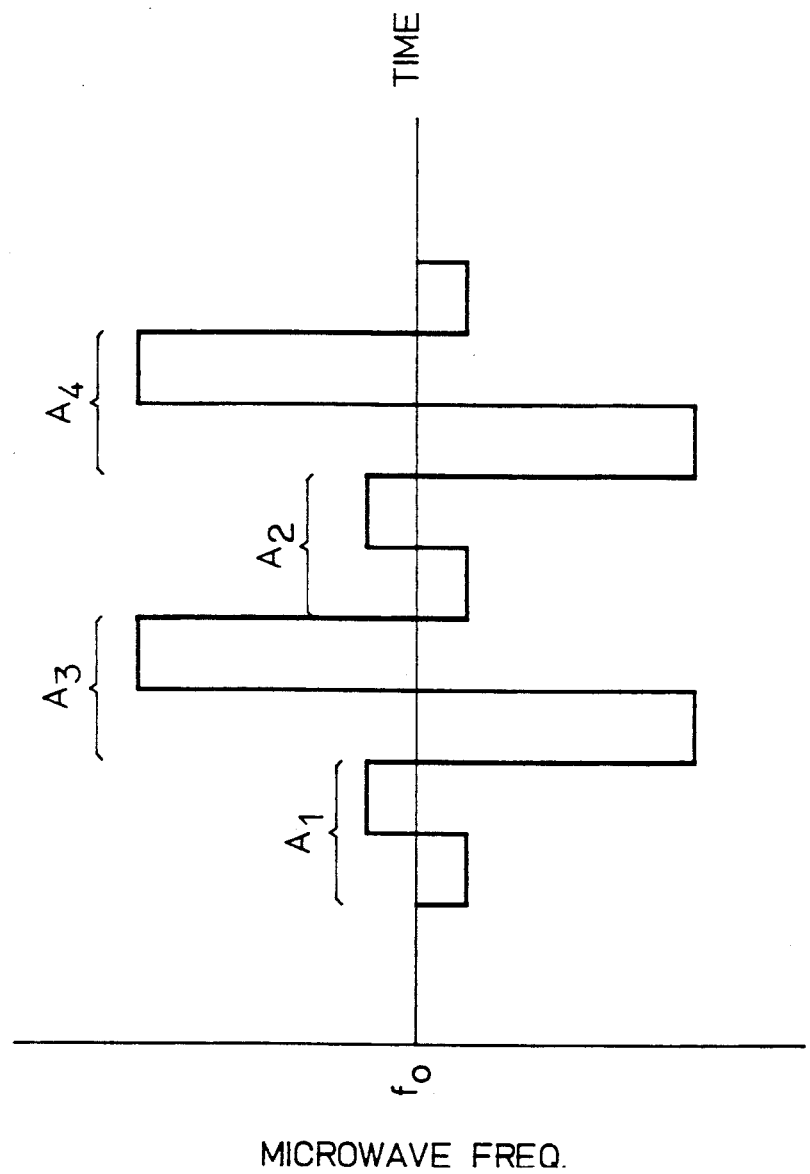

ATOMIC CLOCK SYSTEM WITH IMPROVED SERVO SYSTEM

FIELD OF THE INVENTION

The present invention relates to frequency standards and more particularly to atomic clocks such as those based on cesium beam tubes.

BACKGROUND OF THE INVENTION

Many modern technological applications require precise frequency standards or clocks. For example, very precise navigational standards depend on clocks of extremely high accuracy. Atomic frequency standards form the basis for many such systems. One class of atomic beam standard that has found wide acceptance is based on a cesium beam tube. Cesium beam units are the present basis for most of the national standards of frequency and time. These standards are accurate to a about 1 part in $10^{13}$.

Cesium beam standards utilize quantum effects arising from the nuclear magnetic hyperfine structure in the ground state of the cesium atom. The transition normally utilized arises from the electron-spin, nuclear-spin interaction. The transition in question is relatively insensitive to external influences such as electric and magnetic fields. This transition defines a frequency in the microwave region of the spectrum at 9,192,631,770 Hz.

Basically, the cesium beam tube provides an output that is very sensitive to the frequency of a microwave source which applies energy to the tube. The microwave source is tuned until the output of the tube is maximized. When this condition is satisfied, the frequency of the microwave source will be related in a known manner to the above-described transition frequency.

An ideal cesium beam tube operates as follows. A collimated beam of cesium atoms is passed through a magnetic state selector which selects cesium atoms in a first energy state. The selected atoms then traverse a microwave cavity in which the atoms absorb energy from or give energy to the microwave source. The absorbed or delivered energy causes some fraction of the atoms to make a transition to a second energy state. The number of atoms that made the transition is then determined in an analyzer. The frequency of the microwave source is continuously adjusted in a servo loop to maximize the output of the analyzer.

Prior art cesium beam standards differ from this ideal system. First, for the idealized system to function properly, the amplitude of the microwave radiation in the cavity must remain constant as the frequency of the microwave source is shifted in the search for the maximum of the tube output. Microwave cavities have resonances which depend on the physical structure of the cavity. These resonances are equivalent to a frequency dependent filter which alters the amplitude of the microwave signal in the cavity as the frequency is shifted. In addition, small variations in the intensity of the microwave source are difficult to completely eliminate. For example, such variations can result from temperature sensitive components in the RF chain that drives the microwave cavity. These variations can also alter the amplitude of the signal from the cesium beam tube. The changes in the cesium beam tube output which result from the variations in the intensity of the microwave signal may be mistaken by the servo loop for a shift in oscillator frequency. In this case, the servo loop attempts to correct for the frequency shift by shifting the microwave frequency, thereby introducing an error into the microwave frequency.

A second problem encountered in prior art cesium beam tubes is referred to as "Rabi pulling". The idealized system assumes that all of the atoms entering the microwave cavity are in the same energy state. In practice, there are atoms in several atomic states. The atoms in states having spectral lines adjacent to that of the desired transition give rise to a background signal in the region of the desired spectral line. This background signal is not constant with frequency; hence, it distorts the shape of the desired spectral line. This distortion shifts the position of the maximum of the tube output as a function of microwave frequency, and thus, gives rise to a second source of error in the frequency standard.

Broadly, it is the object of the present invention to provide an improved atomic beam standard.

It is a further object of the present invention to provide an atomic beam standard which is less sensitive to the variation in intensity with frequency of the microwave radiation in the microwave cavity.

It is still a further object of the present invention to provide an atomic beam standard which is less sensitive to Rabi pulling then prior art atomic beam standards.

These and other objects of the present invention will become apparent to those skilled in the art from the following detailed description of the invention and the accompanying drawings.

SUMMARY OF THE INVENTION

The present invention comprises an improved atomic beam clock apparatus and method for controlling the same. The preferred embodiment of the invention includes a cesium source for generating a collimated beam of cesium atoms and a first selector for selecting cesium atoms in a predetermined state. The selected cesium atoms are then subjected to microwave radiation from a microwave source whose frequency is under the control of a controller in said apparatus. A second selector selects cesium atoms in a predetermined state and directs the selected atoms onto a detector which generates a signal related to the number of cesium atoms incident thereon. The controller measures the steady-state output of the detector at each of four predetermined frequencies and computes a frequency correction to be applied to the microwave frequency. In the preferred embodiment of the present invention, the four frequencies consist of two pairs of frequencies, each pair being symmetrically spaced about a center frequency. One frequency of each pair is located on a region of positive slope of the response curve as a function of microwave frequency of the signal generated by the detector and the other frequency of each pair is located on a region of negative slope of the response curve. In the preferred embodiment of the present invention, the steady-output of the detector at each frequency is measured at two different microwave input amplitudes. An amplitude correction to be applied to the microwave amplitude at each pair of frequencies is generated from the amplitude measurements.

BRIEF DESCRIPTION OF THE DRAWINGS

FIG. 5 illustrates the cycling of the microwave frequencies and amplitudes used in one embodiment of the present invention.

DETAILED DESCRIPTION OF THE INVENTION

Figure 1:
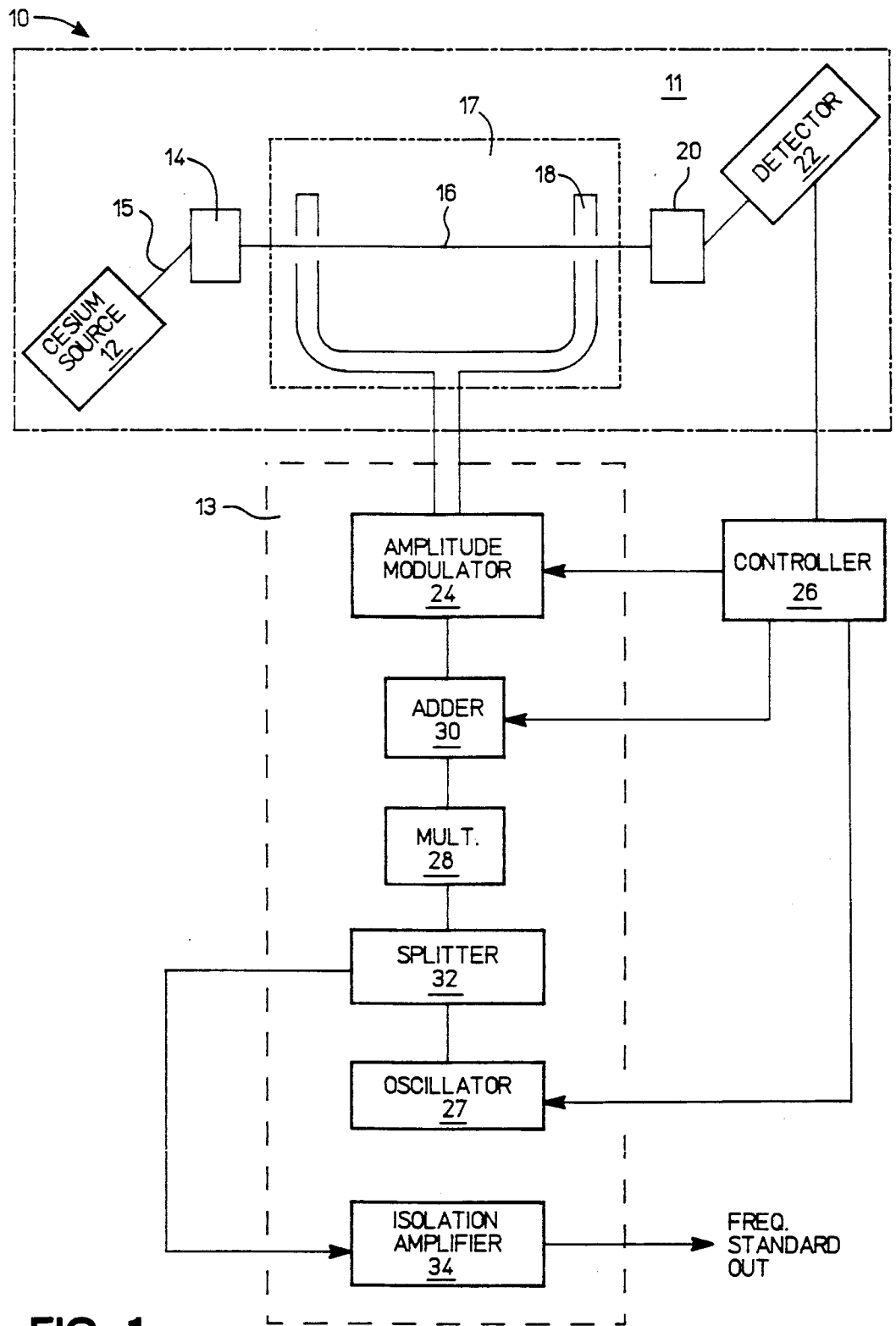
FIG. 1 is a block diagram of cesium beam frequency apparatus, according to the present invention.

A block diagram of the key features of a cesium beam frequency standard apparatus, according to the present invention, is shown in FIG. 1 at 10. Apparatus 10 includes a cesium beam tube 11, a voltage controlled frequency generator 13, and a controller 26. The cesium beam tube operates as follows. A cesium source 12 generates a collimated beam of cesium atoms. Such atomic beam sources are well known to those skilled in the art, and hence, will not be discussed in detail here. For the purposes of the present discussion, it is sufficient to note that the resultant beam of cesium atoms 15 includes atoms in many different energy states. A magnetic state selector 14 is used to select those atoms in predetermined states. The selected cesium atoms pass through a chamber 17 having a small magnetic field referred to as the C field. Chamber 17 also includes a microwave cavity 18 through which the selected cesium atoms 16 pass. Cavity 18 has two branches to provide Ramsey excitation of the cesium atoms. Ramsey excitation is preferred since it only requires careful control of the magnetic field in the regions of chamber 17 in which the cesium beam passes through the branches of cavity 18. The microwaves cause some fraction of the cesium atoms to change energy state. Hence, upon exiting chamber 17, cesium beam 16 will have atoms in a number of different energy states. The atoms in the desired energy state are selected with the aid of a second magnetic analyzer 20. The output of analyzer 20 is quantified by detector 22 whose output is read by controller 26.

Frequency generator 13 provides the microwaves that are introduced into cavity 18. The frequency of the microwaves is controlled by a voltage-controlled crystal oscillator 27 which is under the control of controller 26. Oscillator 27 is often a 10 MHz oscillator. To generate the microwave frequencies needed for beam tube 11, the output of oscillator 27 is multiplied by frequency multiplier 28. As will be explained in more detail below, controller 26 must be able to vary the microwave frequency and amplitude by small amounts. This is accomplished by providing an adder 30 which is constructed from a mixer and an amplitude modulator 24.

Figure 2:
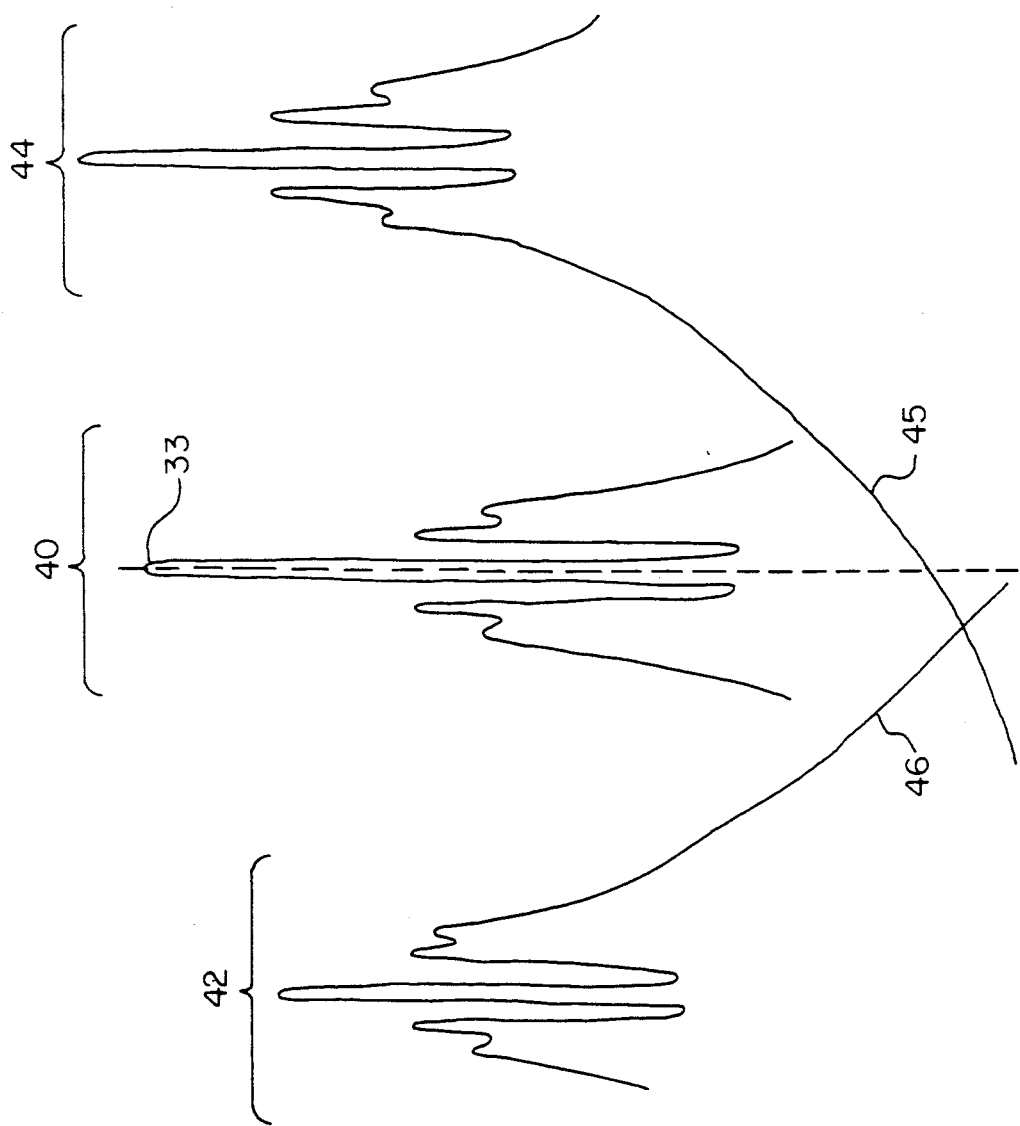
FIG. 2 is a graph of the output of a cesium beam tube as a function of microwave frequency.

FIG. 2 illustrates the output of detector 22 as a function of the frequency of the microwaves injected into cavity 18. The spectrum shown in FIG. 2 includes three outputs corresponding to three transitions, the desired transition shown at 40 and two adjacent transitions shown at 42 and 44. The goal of the servo strategy is tune oscillator 27 such that the atoms corresponding to peak at 33 are incident on the detector. When this goal is met, the output of oscillator 27 will be at the standard frequency. This output is provided to the user via a splitter 32 and isolation amplifier 34. It should be noted that the spectra from the adjacent transitions have tails shown at 45 and 46 which extend into the region of the spectrum corresponding to the desired transition. In general, these tails are not symmetric; hence, the resulting background will be sloped. It is this sloped background that gives rise to the Rabi pulling mentioned above.

Having described the essentials of the apparatus, the manner in which controller 26 controls the frequency of oscillator 27 will now be described in more detail. Controller 26 varies the microwave frequency between four frequencies. The output of detector 22 is measured at each frequency and used to compute an estimate of the error in the oscillator frequency. Controller 26 assumes that the detector output obeys the following approximation:

$$\text{Output} = A(1 + \cos(\pi f/\Delta f)) + B^*f \quad (1)$$

where f is the frequency offset of the microwave input to the cavity relative to the microwave frequency at the resonance, A and B are constants depending on the physical properties of the cesium beam tube, and $\Delta f$ is the width of the center peak at half-power. If Rabi pulling is not present, B=0. The resonance is probed by frequency modulating the microwave signal at four chosen frequency increments in sequence. Adder 30 shown in FIG. 1 is used to increment or decrement the microwave frequency. If the center frequency differs from the resonance frequency by a small offset, df, the steady-state outputs of the detector for the preferred values of the chosen frequencies are given in Table I below.

TABLE I

| | Preferred Modulation Frequencies | |
|---|---|---|
| Cycle Number | Modulation Offset | Detector Output |
| 1 | $-3\Delta f/2$ | $A(1 - \pi df/\Delta f) + B(df - 3\Delta f/2)$ |
| 2 | $-\Delta f/2$ | $A(1 + \pi df/\Delta f) + B(df - \Delta f/2)$ |
| 3 | $\Delta f/2$ | $A(1 - \pi df/\Delta f) + B(df + \Delta f/2)$ |
| 4 | $3\Delta f/2$ | $A(1 + \pi df/\Delta f) + B(df + 3\Delta f/2)$ |

To determine the frequency error, the microwave frequency is modulated by the offsets shown above in a convenient sequence. Sufficient time must be allowed for the detector output to settle before integrating the output of the detector for a fixed sampling period to estimate the output signal during each cycle. After a complete sequence of output signals have been measured, controller 26 computes an estimate, E, of the frequency error according to formula $$E = (S_2 - S_3) + (S_4 - S_1)/3 = \frac{8A\pi df}{3\Delta f} \quad (2)$$

where $S_1$–$S_4$ are the detector outputs during cycles 1–4, respectively. It can be seen from Eq. (2) that the estimate of the error is independent of the background slope, B. Hence, the present invention corrects for Rabi pulling to first order.

It will be apparent to those skilled in the art that higher order corrections can be made by including higher order background terms in Eq. (1). Such higher order correction models would require the frequency to be modulated to a number of additional offsets. It will also be apparent that other choices of modulation offsets may be used. If the exact response of the cesium beam tube to a frequency offset were known, the response function could be used in place of Eq. (2) and other frequency offsets utilized to compute the error estimate. Also, the response function in question is not, in general, known. In principle, it could be measured for each tube, but the accuracy required for the presently achievable performance is greater than can be accomplished. Unfortunately, the response function changes over time; hence, it would need to be periodically measured. Such periodic measurements would require taking the frequency standard system out of service. Hence, systems based on such calibrations are not preferred. The present invention assumes that the response function is an even function frequency about the resonance frequency. If this assumption is made, then four modulation offsets which consist of two pairs of offsets may be used, provided each pair is symmetrically located with respect to the resonance frequency, one point of each pair must be located in a region of positive slope of the response function, and the corresponding point (high or low frequency) of the other pair must be located in a region of negative slope. If these conditions are met, then the error estimate may be calculated from sums and differences of the cesium tube output at the various modulation offsets, and the resulting error estimate will be independent of Rabi pulling to within a third order correction.

Figure 3:
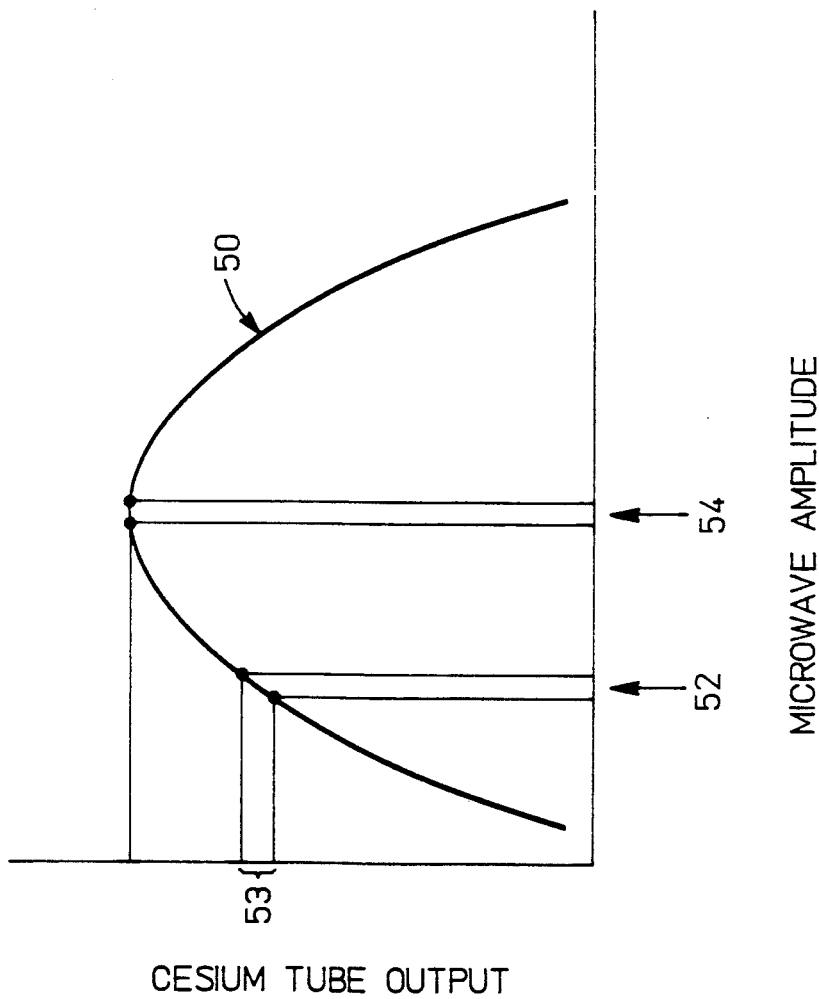
FIG. 3 is a graph of the response of a cesium beam tube as a function of the amplitude of the microwave signal for a given microwave frequency.

As noted above, the output of the cesium beam tube varies with the microwave amplitude even if the microwave frequency is held constant. For any given microwave frequency offset from the resonant frequency, there is a microwave amplitude that produces the maximum cesium beam tube output. A portion of a typical response curve for a cesium beam tube as a function of microwave amplitude is shown in FIG. 3 at 50. It should be noted that there are other maxima at higher amplitudes which have been omitted from the drawing. These maxima are not used since they lead to performance which is inferior to the first maximum. These additional maxima have been omitted from FIG. 3 to simplify the drawing. If the servo loop were to use an amplitude on the sloping portion of the response curve, a small change in microwave amplitude would lead to a change in cesium beam tube output. For example, if the microwave amplitude were to vary between the values shown at 52, the output of the cesium beam tube would vary by the amount shown at 53. If however, the servo loop were to use a microwave amplitude at the maximum of the response curve, the same variation in microwave amplitude, as shown at 54, would produce little or no variation in the cesium beam tube output. Since some variation in the microwave amplitude will almost always occur, it is advantageous to operate the servo loop with microwave amplitudes that are at the peak of the response curve. Hence, the preferred embodiment of the present invention also controls the microwave amplitude such that the amplitude is always near the maximum on the amplitude response curve.

Figure 4:
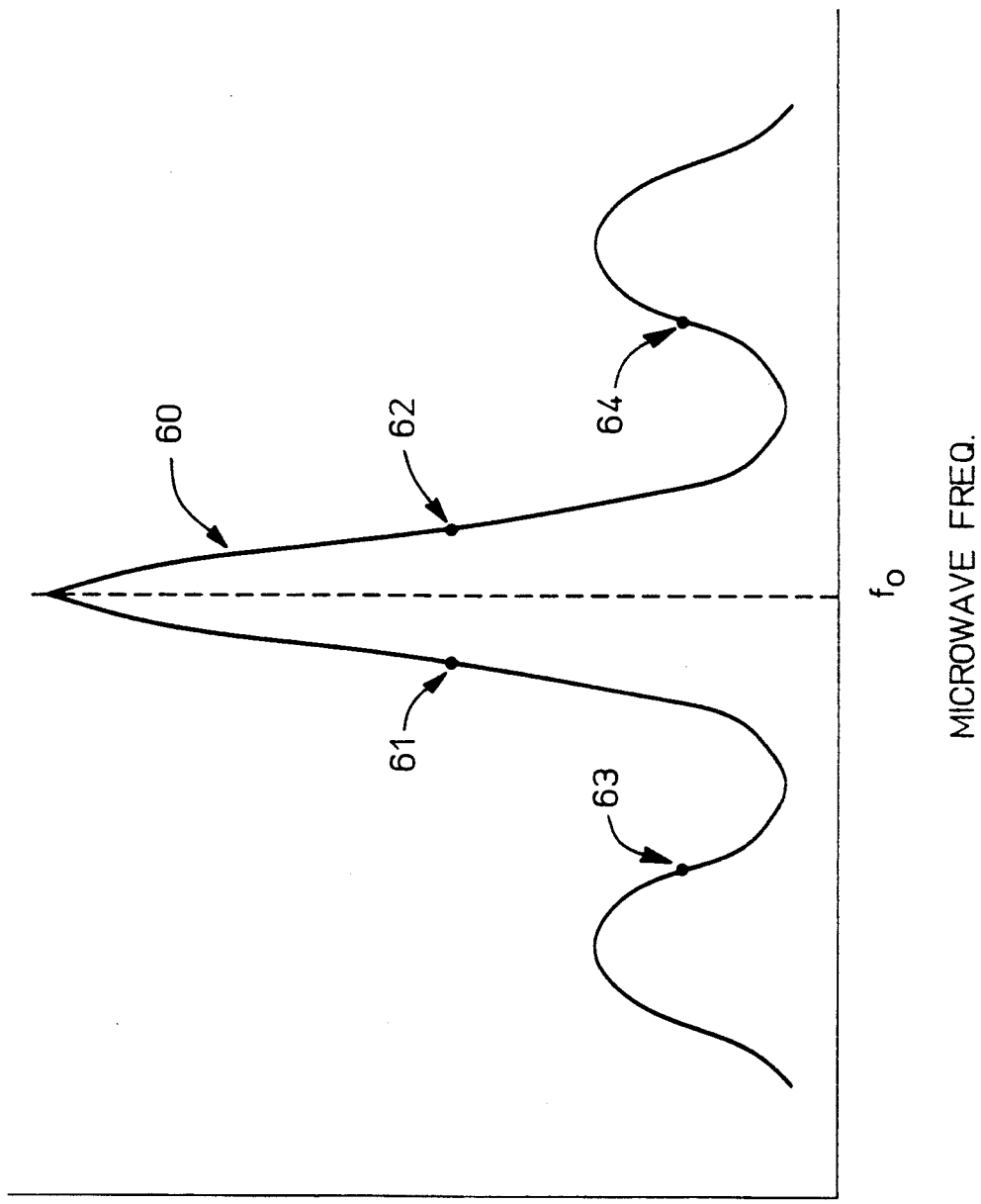
FIG. 4 is a graph of the output of a cesium beam tube as a function of microwave frequency showing the frequency modulation points used in one embodiment of the present invention.

As noted above, the amplitude response curve may be different at different microwave frequencies. The amplitude response curve depends on the difference in frequency between the resonance frequency and the frequency at which the output of the cesium beam tube is measured. As noted above, the preferred embodiment of the present invention measures the cesium beam tube output at two pairs of frequencies. The pairs are shown in FIG. 4 which is an expanded view of the response curve 60 of the cesium beam tube as a function of microwave frequency. The first pair of frequencies shown at 61 and 62 is at the half maximum points on the resonance peak. The second pair of frequencies shown at 63 and 64 are at the half maximum points on the adjacent peaks. Each pair of frequencies is located at the same offset from the resonance frequency $f_0$; hence the amplitude must be independently adjusted for each pair.

The manner in which the amplitude is adjusted will now be explained with reference to FIG. 5 which depicts the frequency and microwave amplitude applied to the cesium beam tube during a typical servo cycle. During the servo loop, the frequency is varied between the four frequency values discussed above. First, the output of the cesium beam tube is measured at the first pair of frequencies using a microwave amplitude $A_1$. Then the output of the cesium beam tube is measured at the second pair of frequencies using a microwave amplitude $A_3$. Next, the output of cesium beam tube is measured again at the first pair of frequencies using a microwave amplitude $A_2$. Finally, the output of the cesium beam tube is measured again at the second pair of frequencies using a microwave amplitude $A_4$. Amplitudes $A_1$ and $A_2$ are small offsets from a microwave amplitude $M_1$ corresponding to the first pair of frequency values, i.e., $$A_1 = M_1 - \delta M \quad (3)$$

and $$A_2 = M_1 + \delta M$$

Similarly, Amplitudes $A_3$ and $A_4$ are small offsets from a microwave amplitude $M_2$ corresponding to the second pair of frequency values, i.e., $$A_3 = M_2 - \delta M \quad (4)$$

and $$A_4 = M_2 + \delta M$$

If $M_1$ is located at the maximum of the response curve of the cesium beam tube as a function of microwave amplitude for the first pair of microwave frequencies, then the difference in the output of the cesium beam tube for the measurements made with $A_1$ and $A_2$ should be zero. If the difference is not zero, an adjustment is made in $M_1$. Similarly, if $M_2$ is located at the maximum of the response curve of the cesium beam tube as a function of microwave amplitude for the second pair of microwave frequencies, then the difference in the output of the cesium beam tube for the measurements made with $A_3$ and $A_4$ should be zero. If the difference is not zero, an adjustment is made in $M_2$. The magnitude of the amplitude modulation, $\delta M$, should be as small as possible, consistent with the noise in the system, to avoid third order effects that might cause errors in determining the maximum of the response curve.

It should be noted that the constant B shown in Eq. (1) depends on the microwave power input to the cavity in the cesium beam tube. Hence, if $M_1$ is not equal to $M_2$, B will no longer be a constant, and the error estimate will differ from that shown in Eq. (2). The manner in which the error signal is calculated in the more general case will now be explained in detail. As noted above, the response of the cesium beam tube as a function of microwave frequency is not known, and furthermore, the function shifts with time. In the absence of Rabi pulling, the microwave frequency response curve is known to be an even function which will be denoted by $G_e(f)$ where f is the frequency departure of the microwave frequency from the atomic resonance. Since $G_e(f)$ is an even function, $G_e(f) = G_e(-f)$.

In the presence of Rabi pulling, the beam current, I(f) from the detector in the cesium beam tube is given by $$I = G_e(f) + B(p)f, \quad (5)$$

where B(p) is the power dependent coefficient for the Rabi pulling.

As noted above, the present invention preferably uses two pairs of modulation offset frequencies $\Delta f_1$ and $\Delta f_2$ about the microwave frequency in the frequency servo loop. If the microwave frequency differs from the resonance frequency by a small frequency offset, $\epsilon$ $$I_{-1} = G_e(-\Delta f_1 + \epsilon) + B_1(-\Delta f_1 + \epsilon) \approx \quad (7)$$
$$G_e(-\Delta f_1) + \epsilon(G_e'(-\Delta f_1) + B_1) - B_1 \Delta f_1$$

$$I_{+1} = G_e(\Delta f_1 + \epsilon) + B_1(\Delta f_1 + \epsilon) \approx$$
$$G_e(\Delta f_1) + \epsilon(G_e'(\Delta f_1) + B_1) + B_1 \Delta f_1$$

$$I_{-2} = G_e(-\Delta f_2 + \epsilon) + B_2(-\Delta f_2 + \epsilon) \approx$$
$$G_e(-\Delta f_2) + \epsilon(G_e'(-\Delta f_2) + B_2) - B_2 \Delta f_2$$

$$I_{+2} = G_e(\Delta f_2 + \epsilon) + B_2(\Delta f_2 + \epsilon) \approx$$
$$G_e(\Delta f_2) + \epsilon(G_e'(\Delta f_2) + B_2) + B_2 \Delta f_2$$

where $I_{-1}$ and $I_{+1}$ are the beam tube currents for $-\Delta f_1$, and $+\Delta f_1$, modulation offsets respectively, and $I_{-2} I_{+2}$ are the beam tube currents for $-\Delta f_2$, and $+\Delta f_2$. $B_1$ and $B_2$ are the coefficients corresponding to the microwave powers used when the frequency is offset by $\Delta f_1$ and $\Delta f_2$, respectively. $G_e'(\Delta f_1)$ is the derivative of $G_e(f)$ evaluated at $\Delta f_1$. Since $G_e(f)$ is an even function, $G_e'(-\Delta f_1) = -G_e'(\Delta f_1)$. Let $$C_1 = I_{+1} - I_{-1} \approx 2\epsilon G_e'(\Delta f_1) + 2B_1 \Delta f_1 \quad (7)$$

$$C_2 = I_{+2} - I_{-2} \approx 2\epsilon G_e'(\Delta f_2) + 2B_2 \Delta f_2$$

The goal of the error signal generator is to combine $C_1$ and $C_2$ to obtain an error signal that does not depend on $B_1$ and $B_2$.

Let $C = C_1 + \alpha C_2$, where $\alpha$ is to be determined. Then $$C = 2\epsilon(G_e'(\Delta f_1) + \alpha G_e'(\Delta f_2)) + 2(B_1 \Delta f_1 + \alpha B_2 \Delta f_2) \quad (8)$$

The second term must vanish for C to vanish when $\epsilon = 0$ and to satisfy the condition that C be independent of $B_1$ and $B_2$; hence, $$\alpha = -\frac{B_1 \Delta f_1}{B_2 \Delta f_2} \quad (9)$$

By definition, $B_1$, $B_2$, $\Delta f_1$, and $\Delta f_2$ are all positive; hence, $\alpha$ is negative. It is advantageous for the error detection signal, C, to have the greatest gain possible; hence, the coefficient of $\epsilon$ is chosen to have maximum absolute value. This will occur when $\Delta f_1$ and $\Delta f_2$ are chosen such that the absolute values of $G_e'(\Delta f_1)$ and $G_e'(\Delta f_2)$ are maximized, and the signs of $G_e'(\Delta f_1)$ and $G_e'(\Delta f_2)$ are opposite. For the special case of $G_e(f) = \cos(\pi f/\Delta f)$ discussed above with reference to Eq. (1), where $\Delta f$ is the linewidth, these conditions will be satisfied when $\Delta f_1 = \frac{1}{2} \Delta f$ and $\Delta f_2 = 3/2 \Delta f$. In this case, $$\alpha = -\frac{B_1}{3B_2} \quad (10)$$

If the optimum power for $\Delta f_1$ equals that for $\Delta f_2$ then $\alpha = -\frac{1}{3}$ which is the value used in the error correction discussed above with reference to Eqs. (1) and (2).

In the general case described by Eq. (9), $\Delta f_1$ and $\Delta f_2$ are chosen to maximize the absolute values of the derivatives $G_e'(\Delta f_1)$ and $G_e'(\Delta f_2)$. In this case, it can be shown that $$\frac{B_1}{B_2} = \frac{P_1}{P_2} \quad (11)$$

where $P_1$ and $P_2$ are the microwave powers needed to maximize the response at $\Delta f_1$ and $\Delta f_2$, respectively. By calibrating the amplitude modulator at the output of the microwave chain, a good approximation to $P_1$ and $P_2$ may be obtained. Any error in the measurement of $P_1/P_2$ results in an incomplete cancellation of the Rabi pulling, but the pulling can be reduced considerably in practical cases. The function of the amplitude servo is to remove, to first order, the frequency shift caused by any amplitude modulation that is coherent with the frequency modulation. Thus, the amplitude modulation scheme of the present invention may be used very advantageously with a conventional two point frequency modulation scheme in addition to the four point frequency modulation scheme of the present invention.

It can be shown that when the microwave amplitude is set to maximize the beam current for any modulation frequency offset, the beam current from the detector in the cesium beam tube only depends on the microwave amplitude in second order, and the first order effects of any coherent amplitude modulation are removed. Setting the microwave amplitude for the maximum beam current at the modulation frequency offset is the optimum way to reduce the frequency pulling due to the coherent amplitude modulation. The major sources of coherent amplitude modulation include microwave cavity detuning which changes with temperature and usually with time, and amplitude versus frequency dependencies in the microwave generator itself. Amplitude modulation that is incoherent with the frequency modulation does not produce frequency shift in first order.

Prior art schemes do not provide effective control of the microwave amplitude. Some prior art control schemes merely rely on an initial adjustment to retain its value. Some prior art schemes detect the microwave level directly in the cavity and use conventional leveling techniques to reduce the coherent modulation. Others set the microwave level to maximize the tube current at zero frequency offset with no frequency modulation. The first two classes of prior art schemes are clearly inferior to the scheme used in the present invention. The last prior art scheme does not set the level at the optimum value and, hence, is also inferior.

It should be noted that the servo to maximize the beam current must work simultaneously with the frequency servo. The amplitude servo is accomplished by small square wave modulation of the microwave signal, each level of the square wave occupying an integral number of complete frequency modulation cycles, so the frequency of the amplitude modulation $F_{am}$ is given by $$F_{am} = \frac{F_{fm}}{2N} \qquad (12)$$

where $F_{fm}$ is the frequency of the frequency modulation and N is an integer $>0$. The present invention makes use of the even symmetry of the beam tube current in frequency offset to synchronously detect the amplitude modulation and close the amplitude servo while synchronously detecting the signal due to frequency modulation and closing the frequency servo. The servos drive both the amplitude and frequency errors to zero.

The same technique is used for each of the pairs of frequencies in the four frequency techniques for reducing Rabi pulling. In this case, two amplitude servos, one for the inner pair of frequencies and one for the outer pair are used. In this case, there are three servos, including the frequency servo, which all work to reduce the amplitude errors and frequency error to zero. Rabi pulling is essentially removed if the microwave powers are known exactly as mentioned earlier.

It should be noted that by dealing with the frequency offsets in pairs, each containing a positive and negative frequency offset of the same value, the present invention only depends on the even symmetry property of the resonance line which is guaranteed (except for small relativistic effects and the Bloch-Siegert effect) provided the microwave signal spectrum driving the tube is symmetric. If one were to use arbitrary offsets, the actual details of the resonance line must be known to the same precision as the line center (about one part in $10^7$). The line is not constant in time, or with power to this precision, and the relevant measurements cannot be made to the necessary precision; hence, a frequency standard based on arbitrary frequency modulation would have performance which is inferior to that provided by the preferred embodiment of the present invention.

It should also be noted that the amplitude servo used in the present invention is not effective in prior art systems which utilize sinusoidal frequency (or phase) modulation to servo the microwave frequency. In these schemes, the optimum RF amplitude is not that which produces maximum beam current (or maximum second harmonic amplitude) averaged over a modulation cycle or maximum beam current with no offset or frequency modulation.

While the above-described embodiments of the present invention have utilized magnetic selectors for selecting the cesium atoms, it will be apparent to those skilled in the art that other forms of selectors may be utilized. For example, the selection process may be accomplished by optical pumping.

Although the present invention has been described in terms of a cesium beam tube, it will be apparent to those skilled in the art that the method and apparatus of the present invention may be utilized with other atomic clock systems.

There has been described herein a novel method for controlling an atomic clock which is less prone to Rabi pulling and corrects for tube aging. Various modifications to the present invention will become apparent to those skilled in the art from the foregoing description and accompanying drawings. Accordingly, the present invention is to be limited solely by the scope of the following claims.

What is claimed is:

1. An atomic clock comprising
   source means for generating an atomic beam;
   first selection means for receiving atoms from said atomic beam selecting atoms in a predetermined state;
   microwave injection means responsive to a frequency control signal for applying microwave radiation of a frequency determined by said control signal to said selected atoms;
   second selection means for selecting atoms in a second predetermined state;
   detection means for receiving said atoms selected by said second selection means for generating and outputting a signal related to the number of atoms in said predetermined second state; and
   control means for generating said frequency control signal and for causing said microwave injection means to apply microwave radiation at four predetermined frequencies, said control means further comprising means for measuring the steady-state output of said detection means at each of said four predetermined frequencies and means for determining a frequency correction from said measured outputs, said frequency control signal being responsive to said frequency correction.

2. The atomic clock of claim 1 wherein said four predetermined frequencies comprise two pairs of frequencies, each said pair being symmetrically spaced about a center frequency.

3. The atomic clock of claim 2 wherein one frequency of each said pair is located on a region of positive slope of the response curve as a function of microwave frequency of said signal generated by said detection means and the other corresponding frequency of the other said pair is located on a region of negative slope of said response curve.

4. The atomic clock of claim 2 wherein said microwave injection means further comprises means for varying the amplitude of said microwave radiation, said amplitude varying means being responsive to an amplitude control signal, and wherein said control means further comprises:
   means for generating said amplitude control signal;
   means for measuring the steady-state output of said detection means at each frequency of one of said pairs of frequencies at a first microwave amplitude, for measuring the steady-state output of said detection means at each frequency of said pair of frequencies at a second microwave amplitude, and for generating an amplitude correction to be applied to said first and second microwave amplitudes from said steady-state measurements.

5. The atomic clock of claim 3 wherein said control means further comprises means for measuring the steady-state output of said detection means at each frequency of the other of said pairs of frequencies at a third microwave amplitude, for measuring the steady-state output of said detection means at each frequency of said pair of frequencies at a fourth microwave amplitude, and for generating an amplitude correction to be applied to said third and fourth microwave amplitudes from said steady-state measurement.

6. In an atomic beam clock including microwave generating means for applying microwave radiation to an atomic beam and detection means for generating a signal related to the number of atoms in said atomic beam which are in a predetermined state after the application of said microwave radiation, said microwave generating means comprising means for adjusting the frequency and amplitude of said microwave radiation, a method for operating said microwave generating means comprising the steps of:

determining the steady-state value of said generated signal at each of four predetermined frequencies; and determining a frequency correction to be applied to said frequency adjusting means.

7. The method of claim 6 wherein said four predetermined frequencies comprise two pairs of frequencies, each said pair being symmetrically spaced about a center frequency.

8. The method of claim 7 wherein one frequency of one said pair is located on a region of positive slope of the response curve as a function of microwave frequency of said signal generated by said detection means and the corresponding frequency of the other said pair is located on a region of negative slope of said response curve.

9. The method of claim 7 wherein said microwave generating means further comprises means for varying the amplitude of said microwave radiation, and method further comprising the steps of:

measuring the steady-state output of said detection means at each of frequency of one of said pairs of frequencies at a first microwave amplitude, measuring the steady-state output of said detection means at each frequency of said pair of frequencies at a second microwave amplitude, and generating an amplitude correction to be applied to said first and second microwave amplitudes from said steady-state measurements.

10. The method of claim 7 further comprising the steps of measuring the steady-state output of said detection means at each frequency the other of said pairs of frequencies at a third microwave amplitude, measuring the steady-state output of said detection means at each frequency of said pair of frequencies at a fourth microwave amplitude, and generating an amplitude correction to be applied to said third and fourth microwave amplitudes from said steady-state measurements.

11. An atomic clock comprising source means for generating an atomic beam;

first selection means for receiving atoms from said atomic beam selecting atoms in a predetermined state;

microwave injection means responsive to a frequency control signal for applying microwave radiation of a frequency determined by said control signal to said selected atoms;

second selection means for selecting atoms in a second predetermined state;

detection means for receiving said atoms selected by said second selection means and for generating and outputing a signal related to the number of atoms in said predetermined second state; and control means for generating said frequency control signal and for causing said microwave injection means to apply microwave radiation at a pair of predetermined frequencies, said control means further comprising means for measuring the steady-state output of said detection means at each frequency of said pair of predetermined frequencies and means for determining a frequency correction from said measured outputs, said frequency control signal being responsive to said frequency correction, said microwave injection means further comprising means for varying the amplitude of said microwave radiation, said amplitude varying means being responsive to an amplitude control signal, and wherein said control means further comprises:

means for generating said amplitude control signal; and means for measuring the steady-state output of said detection means at each frequency of said pair of frequencies at a first microwave amplitude, for measuring the steady-state output of said detection means at each frequency of said pair of frequencies at a second microwave amplitude, and for generating an amplitude correction to be applied to said first and second microwave amplitudes from said steady-state measurements.

12. In an atomic beam clock including microwave generating means for applying microwave radiation to an atomic beam and detection means for generating a signal related to the number of atoms in said atomic beam which are in a predetermined state after the application of said microwave radiation, said microwave generating means comprising means for adjusting the frequency and amplitude of said microwave radiation, a method for operating said microwave generating means comprising the steps of:

determining the steady-state value of said generated signal at each frequency of a predetermined pair of frequencies at a first microwave amplitude;

determining the steady-state output of said detection means at each frequency of said pair of frequencies at a second microwave amplitude; and generating an amplitude correction to be applied to said first and second microwave amplitudes from said steady-state measurements.

* * * * *